(12) United States Patent
Uryu et al.

(10) Patent No.: US 12,009,229 B2
(45) Date of Patent: Jun. 11, 2024

(54) LASER PROCESSING APPARATUS

(71) Applicant: DISCO CORPORATION, Tokyo (JP)

(72) Inventors: Hiroki Uryu, Tokyo (JP); Seiji Miura, Tokyo (JP); Haruhiko Asahi, Tokyo (JP); Hisatoshi Fujisawa, Tokyo (JP); Yoshiki Kobayashi, Tokyo (JP); Hidenori Akamatsu, Tokyo (JP)

(73) Assignee: DISCO CORPORATION, Tokyo (JP)

(*) Notice: Subject to any disclaimer, the term of this patent is extended or adjusted under 35 U.S.C. 154(b) by 873 days.

(21) Appl. No.: 17/003,491

(22) Filed: Aug. 26, 2020

(65) Prior Publication Data

US 2021/0066101 A1 Mar. 4, 2021

(30) Foreign Application Priority Data

Aug. 27, 2019 (JP) .................................. 2019-155067

(51) Int. Cl.
*B23K 26/08* (2014.01)
*B23K 26/03* (2006.01)
(Continued)

(52) U.S. Cl.
CPC ...... *H01L 21/67092* (2013.01); *B23K 26/032* (2013.01); *B23K 26/0622* (2015.10);
(Continued)

(58) Field of Classification Search
CPC ......... H01L 21/67092; H01L 21/67115; H01L 21/67253; H01L 21/6836;
(Continued)

(56) References Cited

U.S. PATENT DOCUMENTS

| 6,204,470 B1* | 3/2001 | Sasaki ................. B23K 26/702 |
| | | 219/121.61 |
| 2005/0141581 A1* | 6/2005 | Kondo ..................... H01S 5/42 |
| | | 372/50.1 |

(Continued)

FOREIGN PATENT DOCUMENTS

| DE | 102015003697 A1 | 10/2015 |
| DE | 102016205915 A1 | 10/2016 |

(Continued)

OTHER PUBLICATIONS

Office Action issued in counterpart German patent application No. 10 2020 210 788.2, dated Aug. 30, 2022.

(Continued)

*Primary Examiner* — Nahida Sultana
(74) *Attorney, Agent, or Firm* — Greer, Burns & Crain, Ltd.

(57) ABSTRACT

A laser beam irradiating unit of a laser processing apparatus includes a laser oscillator, a mirror configured to reflect a laser beam emitted from the laser oscillator and propagate the laser beam to a processing point, a power measuring unit configured to measure power of leakage light of the laser beam transmitted without being reflected by the mirror, and a condensing lens configured to condense the laser beam propagated by the mirror and irradiate a workpiece with the condensed laser beam. The control unit measures the power of the leakage light of the laser beam by the power measuring unit while irradiating the workpiece with the laser beam.

9 Claims, 4 Drawing Sheets

(51) Int. Cl.
  *B23K 26/06* (2014.01)
  *B23K 26/0622* (2014.01)
  *B23K 26/53* (2014.01)
  *B23K 26/70* (2014.01)
  *G01J 1/44* (2006.01)
  *G05B 19/4155* (2006.01)
  *H01L 21/67* (2006.01)
  *H01L 21/683* (2006.01)
  *B23K 103/00* (2006.01)

(52) U.S. Cl.
  CPC ...... *B23K 26/0643* (2013.01); *B23K 26/0648* (2013.01); *B23K 26/0665* (2013.01); *B23K 26/0853* (2013.01); *B23K 26/53* (2015.10); *B23K 26/705* (2015.10); *G01J 1/44* (2013.01); *G05B 19/4155* (2013.01); *H01L 21/67115* (2013.01); *H01L 21/67253* (2013.01); *H01L 21/6836* (2013.01); *B23K 2103/56* (2018.08); *G05B 2219/34031* (2013.01); *H01L 2221/68327* (2013.01)

(58) Field of Classification Search
  CPC ........ H01L 2221/68327; B23K 26/032; B23K 26/0622; B23K 26/0643; B23K 26/0648; B23K 26/0665; B23K 26/0853; B23K 26/53; B23K 26/705; B23K 2103/56; B23K 26/707; B23K 26/0884; B23K 26/702; B23K 2101/40; B23K 26/38; G01J 1/44; G01J 1/4257; G05B 19/4155; G05B 2219/34031; G05B 2219/45041; G05B 2219/45154; G05B 19/406; B28D 5/0058
  See application file for complete search history.

(56) References Cited

U.S. PATENT DOCUMENTS

| | | | |
|---|---|---|---|
| 2005/0163174 A1* | 7/2005 | Nakayama | B23K 26/0622 372/22 |
| 2012/0037603 A1* | 2/2012 | Venturini | B23K 26/0006 219/121.65 |
| 2014/0197140 A1 | 7/2014 | Unrath | |
| 2017/0003511 A1* | 1/2017 | Laux | H01S 3/0057 |

FOREIGN PATENT DOCUMENTS

| | | | | |
|---|---|---|---|---|
| DE | 102018205546 A1 | * | 10/2018 | ........ B23K 26/032 |
| DE | 102018205546 A1 | | 10/2018 | |
| DE | 102018128801 A1 | * | 5/2019 | ........ B23K 26/0643 |
| DE | 102018128801 A1 | | 5/2019 | |
| FR | 2682476 A1 | | 4/1993 | |
| FR | 2682476 A1 | * | 4/1993 | ........... G01J 1/4257 |
| JP | H06142218 A | | 5/1994 | |
| JP | H06237028 A | | 8/1994 | |
| JP | H07251277 A | | 10/1995 | |
| JP | 2002192370 A | | 7/2002 | |
| JP | 2003320466 A | | 11/2003 | |
| JP | 2006247681 A | | 9/2006 | |
| JP | 2006247681 A | * | 9/2006 | ........... G01J 1/4257 |
| JP | 2007190587 A | | 8/2007 | |
| JP | 2013128944 A | | 7/2013 | |
| JP | 2014237167 A | | 12/2014 | |
| WO | 2016108139 A1 | | 7/2016 | |

OTHER PUBLICATIONS

1 Search report issued in counterpart Singapore patent application No. 10202007680R, dated Jul. 6, 2021.
Translated Office Action issued in counterpart Japanese patent application No. 2019-155067, dated Sep. 28, 2023.

* cited by examiner

LASER PROCESSING APPARATUS

BACKGROUND OF THE INVENTION

Field of the Invention

The present invention relates to a laser processing apparatus.

Description of the Related Art

Known as methods for processing a workpiece such as a semiconductor wafer are a method of forming a processed groove by irradiating the top surface of the workpiece with a laser beam of an absorbable wavelength and a method of forming a modified layer serving as a division starting point by condensing a laser beam of a wavelength transmissible through the workpiece within the workpiece and irradiating the inside of the workpiece with the laser beam (see Japanese Patent Laid-Open No. 2003-320466 and Japanese Patent Laid-Open No. 2002-192370).

SUMMARY OF THE INVENTION

With regard to a laser processing apparatus that performs the above-described laser processing, there is an increasing demand to suppress a division defect in the workpiece or the like by monitoring a change in power of the laser beam during the processing. A method of blocking an optical path by a power measuring unit or a method of stopping the processing and irradiating a power measuring unit with the laser beam is performed as a method of measuring the power of the laser beam. However, these methods require the processing to be stopped, and it is thus difficult to measure the power while processing the workpiece.

It is accordingly an object of the present invention to provide a laser processing apparatus that can monitor the power of a laser beam during processing without stopping the processing while processing a workpiece.

In accordance with an aspect of the present invention, there is provided a laser processing apparatus including a chuck table configured to hold a workpiece, a laser beam irradiating unit configured to irradiate the workpiece held on the chuck table with a pulsed laser beam, a processing feed unit configured to processing-feed the chuck table and the laser beam irradiating unit relative to each other, an indexing feed unit configured to indexing-feed the chuck table and the laser beam irradiating unit relative to each other, and a control unit, the laser beam irradiating unit including a laser oscillator, a mirror configured to reflect the laser beam emitted from the laser oscillator and propagate the laser beam to a processing point, a power measuring unit configured to measure power of leakage light of the laser beam transmitted without being reflected by the mirror, and a condensing lens configured to condense the laser beam propagated by the mirror and irradiate the workpiece with the condensed laser beam, wherein the control unit allows to measure the power of the leakage light of the laser beam by the power measuring unit while irradiating the workpiece with the laser beam.

Preferably, the control unit includes a signal generating section configured to generate a signal controlling timing of pulse oscillation of the laser oscillator, and a signal synchronizing section configured to synchronize timing of measurement of the power of the leakage light of the laser beam by the power measuring unit with the signal generated by the signal generating section, and wherein the control unit allows to measure the power of the leakage light of the laser beam by the power measuring unit only while a pulsed laser is oscillated from the laser oscillator.

Preferably, the leakage light of the laser beam is made incident on the power measuring unit after passing through a wavelength selecting filter disposed in front of the power measuring unit and configured to transmit only a laser beam of a wavelength used for processing.

Preferably, the power measuring unit is formed by a position sensing device (PSD). Preferably, the control unit further includes a warning notifying section configured to give notification of a warning when the power of the leakage light of the laser beam measured by the power measuring unit falls outside a predetermined threshold value range. Preferably, positional information is measured by the power measuring unit simultaneously with the power of the leakage light of the laser beam.

Preferably, the control unit further includes at least one of a pass/fail determining section configured to determine whether or not an amount of variation in a position of the leakage light of the laser beam measured by the power measuring unit is within a predetermined threshold value range and a recording section configured to record data measured by the power measuring unit.

According to the invention of the present application, it is possible to monitor the power of a laser beam during processing without stopping the processing while processing a workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the drawings. The present invention is not limited by contents described in the following embodiment. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

Figure 1:
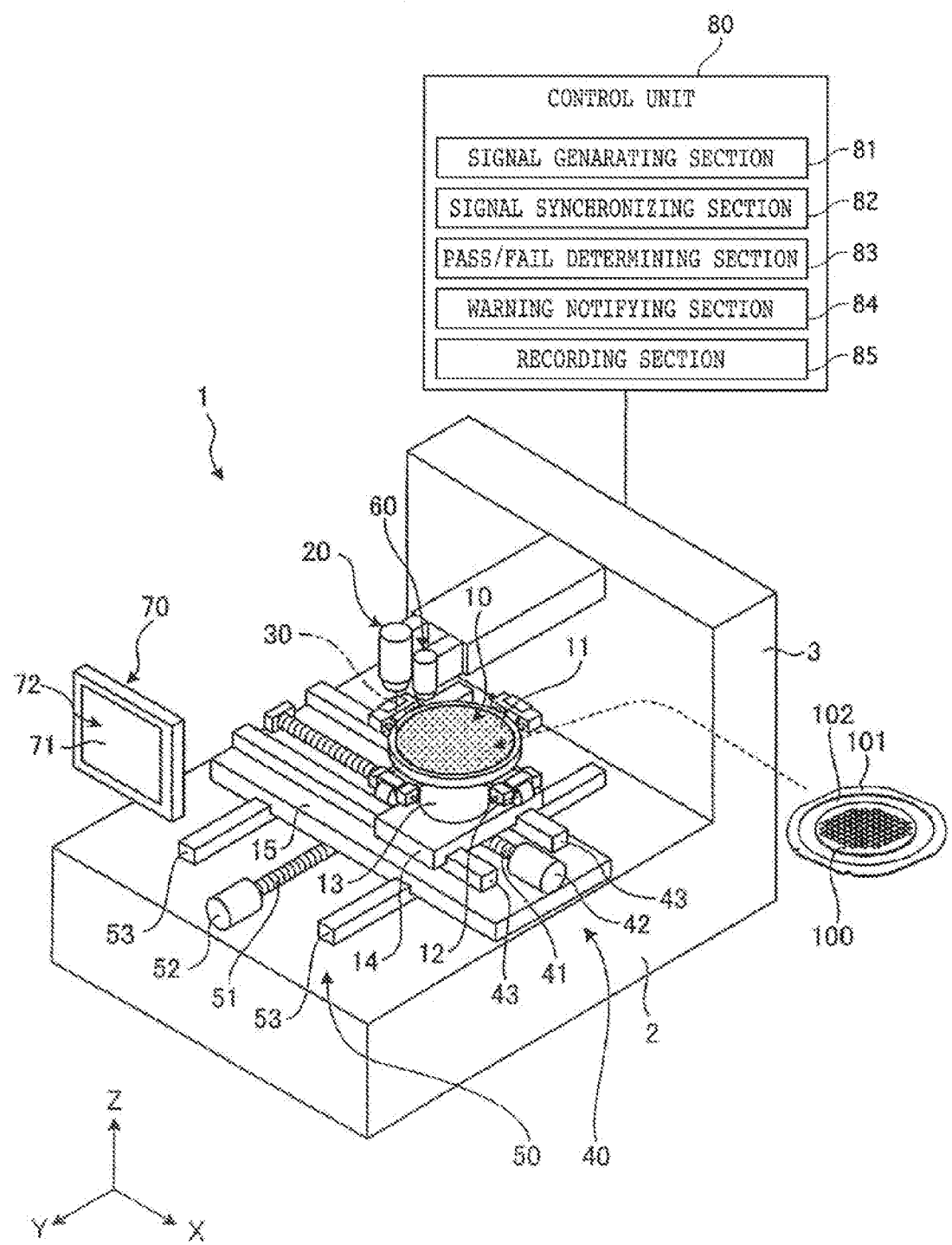
FIG. 1 is a perspective view illustrating an example of a configuration of a laser processing apparatus according to an embodiment.
Figure 2:
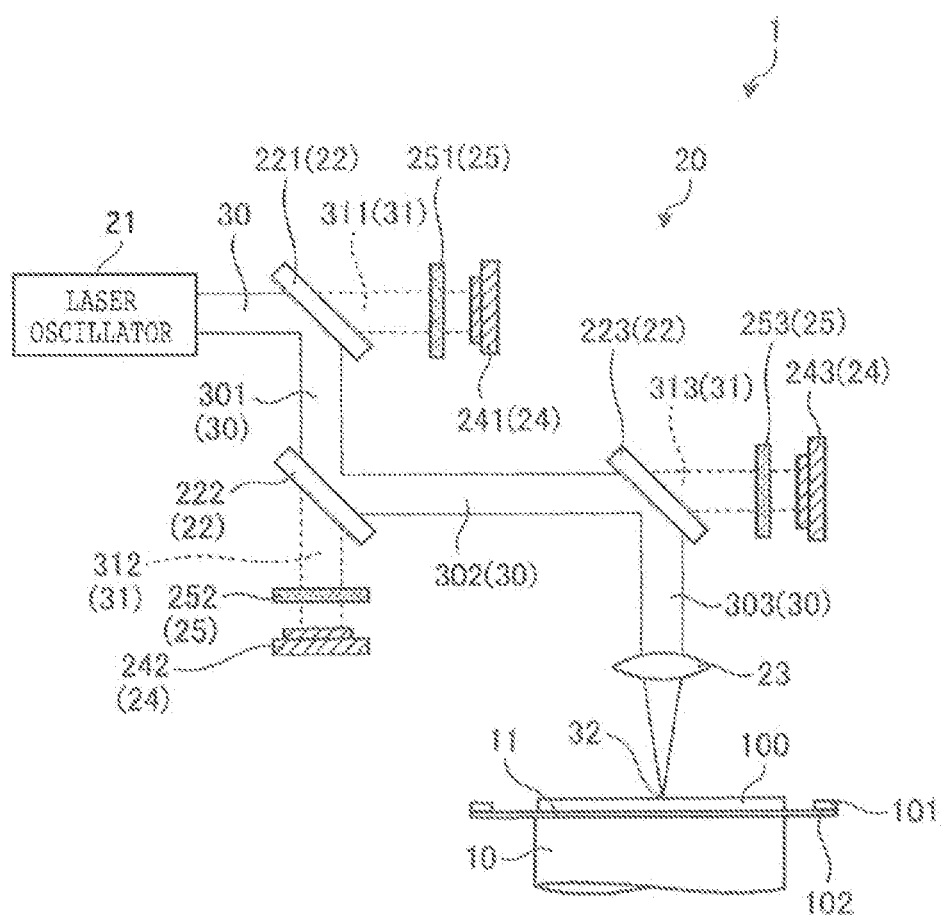
FIG. 2 is a schematic diagram schematically illustrating a configuration of a laser beam irradiating unit of the laser processing apparatus depicted in FIG. 1.
Figure 3:
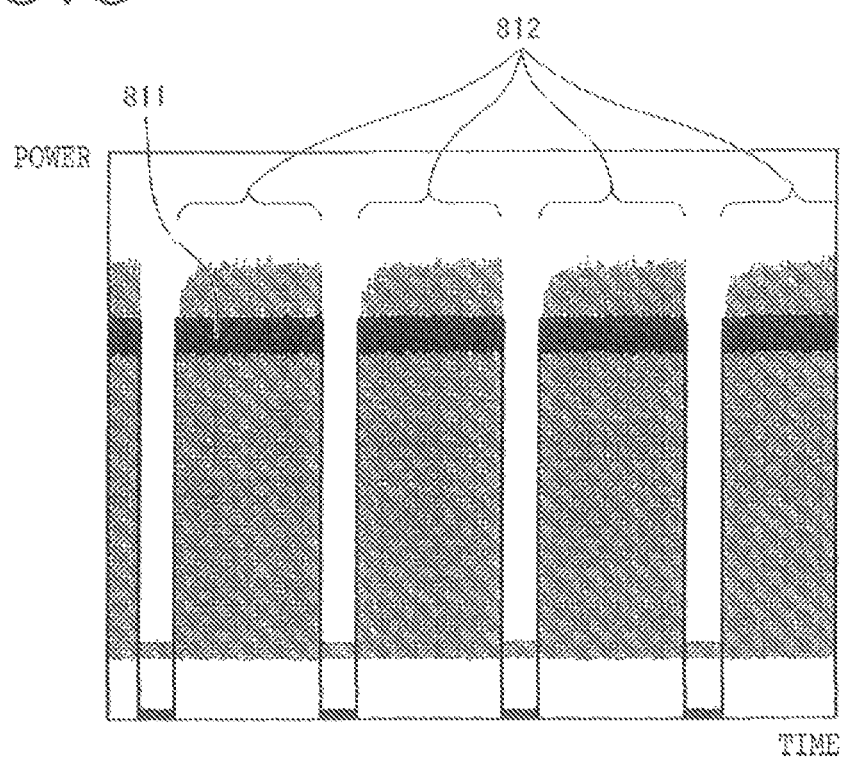
FIG. 3 is a schematic graph illustrating an example of a measured value measured by a power measuring unit according to the embodiment.
Figure 4:
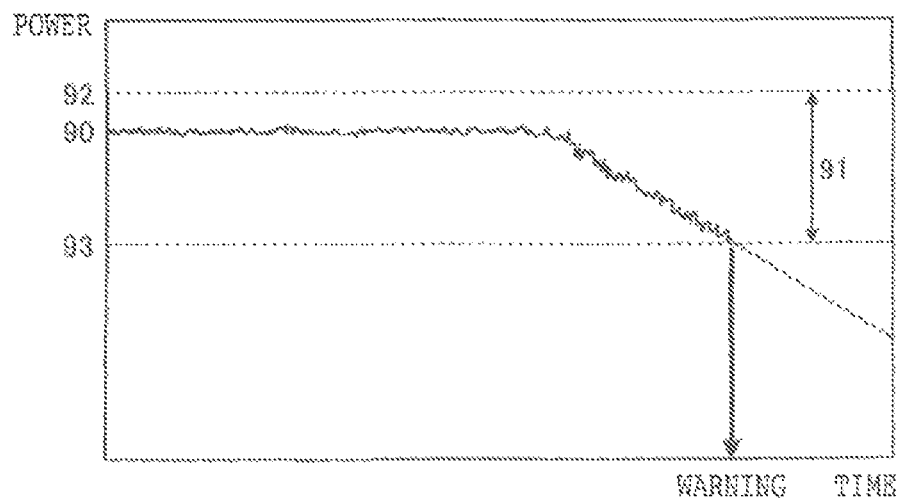
FIG. 4 is a schematic graph illustrating an example of a measured value when the measured value depicted in FIG. 3 is synchronized with a gate signal for pulse oscillation.
Figure 5:
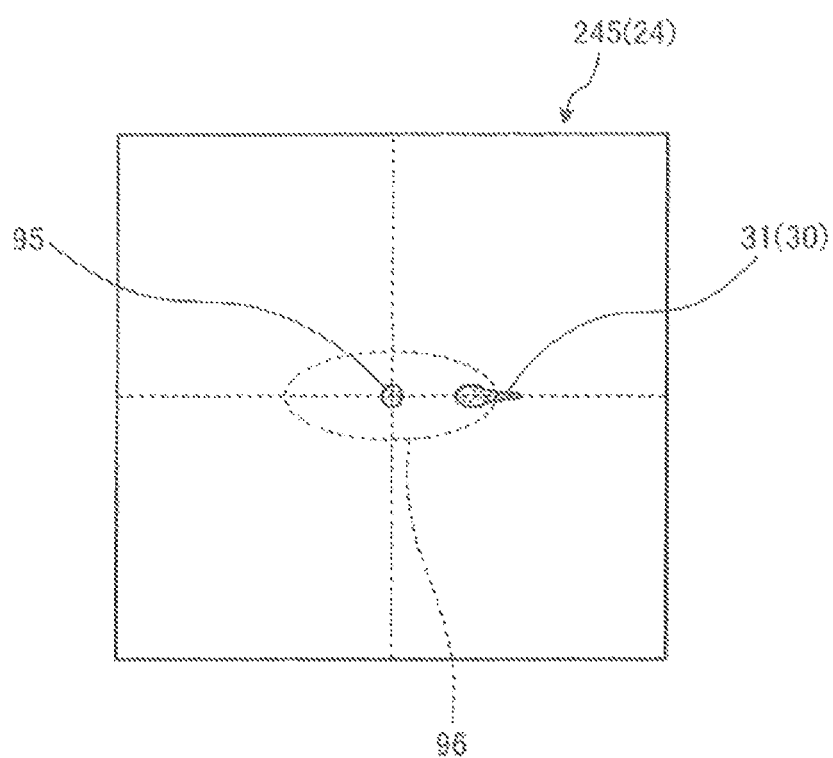
FIG. 5 is a schematic diagram illustrating an example of a measured position of leakage light which position is measured by the power measuring unit according to the embodiment.

A configuration of a laser processing apparatus 1 according to an embodiment of the present invention will first be described with reference to the drawings. FIG. 1 is a perspective view illustrating an example of the configuration of the laser processing apparatus 1 according to the embodiment. FIG. 2 is a schematic diagram schematically illustrating a configuration of a laser beam irradiating unit 20 of the laser processing apparatus 1 depicted in FIG. 1. FIG. 3 is a schematic graph illustrating an example of a measured value measured by a power measuring unit 24 according to the embodiment. FIG. 4 is a schematic graph illustrating an example of a measured value when the measured value depicted in FIG. 3 is synchronized with a gate signal 811 for pulse oscillation. FIG. 5 is a schematic diagram illustrating an example of a measured position of leakage light 31 which position is measured by the power measuring unit 24 according to the embodiment. In the following description, an X-axis direction is one direction in a horizontal plane. A Y-axis direction is a direction orthogonal to the X-axis direction in the horizontal plane. A Z-axis direction is a direction orthogonal to the X-axis direction and the Y-axis direction. In the laser processing apparatus 1 according to the embodiment, a processing feed direction is the X-axis direction, and an indexing feed direction is the Y-axis direction.

As depicted in FIG. 1, the laser processing apparatus 1 includes a chuck table 10, a laser beam irradiating unit 20, a processing feed unit 40, an indexing feed unit 50, an imaging unit 60, a display unit 70, and a control unit 80. The laser processing apparatus 1 according to the embodiment is an apparatus that processes a workpiece 100 by irradiating the workpiece 100 as a processing target with a laser beam 30. The processing of the workpiece 100 by the laser processing apparatus 1 is, for example, modified layer formation processing of forming a modified layer within the workpiece 100 by stealth dicing, groove processing of forming a groove in the top surface of the workpiece 100, cutting processing of cutting the workpiece 100 along planned dividing lines, or the like.

The workpiece 100 is a wafer such as a semiconductor device wafer or an optical device wafer in a disk shape which wafer has a substrate of silicon, sapphire, gallium arsenide, or the like. The workpiece 100 has a plurality of planned dividing lines set in a lattice manner on the top surface of the substrate and devices formed in regions demarcated by the planned dividing lines. The devices are, for example, an integrated circuit such as an integrated circuit (IC) or large scale integration (LSI), an image sensor such as a charge coupled device (CCD) image sensor or a complementary metal oxide semiconductor (CMOS) image sensor, a microelectromechanical system (MEMS), or the like. The workpiece 100 is divided into individual devices along the planned dividing lines and manufactured into chips. A chip includes a part of the substrate and a device on the substrate. The planar shape of the chip is, for example, a square shape or a rectangular shape.

The workpiece 100 processed by the laser processing apparatus 1 is supported by an annular frame 101 and an expandable tape 102 in the embodiment. The annular frame 101 has an opening larger than the outside diameter of the workpiece 100. The expandable tape 102 is affixed to the undersurface side of the annular frame 101. The expandable tape 102 includes, for example, a base material layer formed by an elastic synthetic resin and an adhesive layer laminated to the base material layer and formed by an elastic and adhesive synthetic resin. The workpiece 100 is fixed to the annular frame 101 and the expandable tape 102 by being positioned at a predetermined position in the opening of the annular frame 101 and being affixed, at the undersurface thereof, to the expandable tape 102.

The chuck table 10 holds the workpiece 100 by a holding surface 11. The holding surface 11 has a disk shape formed of a porous ceramic or the like. The holding surface 11 in the embodiment is a plane parallel with a horizontal direction. The holding surface 11 is, for example, connected to a vacuum suction source via a vacuum suction path. The chuck table 10 sucks and holds the workpiece 100 mounted on the holding surface 11. A plurality of clamp units 12 that hold the annular frame 101 supporting the workpiece 100 are arranged on the periphery of the chuck table 10. A rotating unit 13 rotates the chuck table 10 about an axis parallel with the Z-axis direction. An X-axis direction moving plate 14 supports the rotating unit 13. The processing feed unit 40 moves the rotating unit 13 and the chuck table 10 in the X-axis direction via the X-axis direction moving plate 14. The indexing feed unit 50 moves the rotating unit 13 and the chuck table 10 in the Y-axis direction via the X-axis direction moving plate 14, the processing feed unit 40, and a Y-axis direction moving plate 15.

The laser beam irradiating unit 20 is a unit that irradiates the workpiece 100 held on the chuck table 10 with a pulsed laser beam 30. The laser beam irradiating unit 20 includes a laser oscillator 21, a mirror 22, a condensing lens 23, a power measuring unit 24, and a wavelength selecting filter 25.

The laser oscillator 21 oscillates a pulsed laser having a predetermined wavelength for processing the workpiece 100. The laser beam 30 applied by the laser beam irradiating unit 20 may be of a wavelength transmissible through the workpiece 100 or may be of a wavelength absorbable by the workpiece 100. The laser oscillator 21 includes, for example, an yttrium Aluminum Garnet (YAG) laser oscillator, an yttrium orthovanadate (YVO4) laser oscillator, and the like.

The mirror 22 reflects the laser beam 30 emitted from the laser oscillator 21 and propagates the laser beam 30 to a processing point of the workpiece 100 held on the holding surface 11 of the chuck table 10. In a case where the laser beam 30 emitted from the laser oscillator 21 is ultraviolet ray (UV), for example, a reflective film reflecting UV is formed on the mirror 22. The reflective film formed on the mirror 22 reflects most of the laser beam 30 but transmits approximately a few percent of the laser beam 30 without reflection. In addition, even when the laser beam 30 emitted from the laser oscillator 21 is UV, infrared rays (IR) and light of a wavelength of green or the like may be mixed in the laser beam 30. In this case, the mirror 22 transmits the laser beam 30 of IR, green, and the like other than UV without reflection.

The mirror 22 in the embodiment includes a first mirror 221, a second mirror 222, and a third mirror 223. The first mirror 221 reflects, as a first laser beam 301, the laser beam 30 oscillated by the laser oscillator 21, toward the second mirror 222. The second mirror 222 reflects, as a second laser beam 302, the first laser beam 301 reflected by the first mirror 221, toward the third mirror 223. The third mirror 223 reflects, as a third laser beam 303, the second laser beam 302 reflected by the second mirror 222, toward the workpiece 100.

The condensing lens 23 forms a condensing point 32 by condensing the laser beam 30 reflected by the mirror 22 and irradiates the workpiece 100 with the condensing point 32.

The power measuring unit 24 measures the power of the leakage light 31 of the laser beam 30 transmitted without being reflected by the mirror 22. In addition, the power measuring unit 24 detects the position of the laser beam 30 within a measurement plane 245 (see FIG. 5) for measuring the leakage light 31 of the laser beam 30. The power measuring unit 24 in the embodiment includes a position detecting element (PSD). However, the power measuring unit 24 may, for example, be a thermopile power meter, a photodetector power meter, or the like. The PSD measures the current value of a current flowing according to incidence of light. The control unit 80 to be described later, for example, converts the current value measured by the PSD to the power of the leakage light 31 of the laser beam 30. In the case where the power measuring unit 24 includes a PSD, the power measuring unit 24 may receive the leakage light 31 of the laser beam 30 via a neutral density (ND) filter that equally absorbs an amount of light. The PSD measures a position at which light enters, on the basis of a current ratio of each current flowing in a resistance layer divided into four parts. For example, the control unit 80 to be described later determines a position at which light enters, on the basis of each current ratio measured by the PSD. The power measuring unit 24 in the embodiment outputs a measurement result to the control unit 80 at fixed time intervals.

The power measuring unit 24 in the embodiment includes a first power measuring unit 241, a second power measuring unit 242, and a third power measuring unit 243. The first power measuring unit 241 receives, as first leakage light 311, the leakage light 31 of the laser beam 30 which leakage light is transmitted without being reflected by the first mirror 221, and measures the power of the first leakage light 311. The second power measuring unit 242 receives, as second leakage light 312, the leakage light 31 of the laser beam 30 which leakage light is transmitted without being reflected by the second mirror 222, and measures the power of the second leakage light 312. The third power measuring unit 243 receives, as third leakage light 313, the leakage light 31 of the laser beam 30 which leakage light is transmitted without being reflected by the third mirror 223, and measures the power of the third leakage light 313.

The wavelength selecting filter 25 is disposed in front of the power measuring unit 24. The wavelength selecting filter 25 is a filter that transmits only the laser beam 30 of a wavelength used for processing. In the case where the laser beam 30 emitted from the laser oscillator 21 is UV, for example, the wavelength selecting filter 25 transmits only UV. The wavelength selecting filter 25 is, for example, one of a band-pass filter, a dichroic filter, a long-pass filter, and a short-pass filter, or a filter having a configuration as a combination thereof. The band-pass filter is a filter that freely selects a specific wavelength and transmits the specific wavelength. The dichroic filter is a filter that reflects light in a specific wavelength range and transmits light in a remaining wavelength range. The long-pass filter is a filter that transmits light of wavelengths longer than a predetermined wavelength. The short-pass filter is a filter that transmits light of wavelengths shorter than a predetermined wavelength.

The wavelength selecting filter 25 in the embodiment includes a first wavelength selecting filter 251, a second wavelength selecting filter 252, and a third wavelength selecting filter 253. The first wavelength selecting filter 251 is disposed in front of the first power measuring unit 241. The first wavelength selecting filter 251 transmits only a laser beam 30 of a wavelength used for processing, in the first leakage light 311 of the laser beam 30. The second wavelength selecting filter 252 is disposed in front of the second power measuring unit 242. The second wavelength selecting filter 252 transmits only a laser beam 30 of the wavelength used for processing, in the second leakage light 312 of the laser beam 30. The third wavelength selecting filter 253 is disposed in front of the third power measuring unit 243. The third wavelength selecting filter 253 transmits only a laser beam 30 of the wavelength used for processing, in the third leakage light 313 of the laser beam 30.

As depicted in FIG. 1, the processing feed unit 40 is a unit that moves the chuck table 10 and the laser beam irradiating unit 20 relative to each other in the X-axis direction as the processing feed direction. The processing feed unit 40 in the embodiment moves the chuck table 10 in the X-axis direction. The processing feed unit 40 in the embodiment is installed on an apparatus main body 2 of the laser processing apparatus 1. The processing feed unit 40 supports the X-axis direction moving plate 14 movably in the X-axis direction. The processing feed unit 40 includes a well-known ball screw 41, a well-known pulse motor 42, and well-known guide rails 43. The ball screw 41 is provided rotatably about an axis. The pulse motor 42 rotates the ball screw 41 about the axis. The guide rails 43 support the X-axis direction moving plate 14 movably in the X-axis direction. The guide rails 43 are arranged so as to be fixed to the Y-axis direction moving plate 15.

The indexing feed unit 50 is a unit that moves the chuck table 10 and the laser beam irradiating unit 20 relative to each other in the Y-axis direction as the indexing feed direction. The indexing feed unit 50 in the embodiment moves the chuck table 10 in the Y-axis direction. The indexing feed unit 50 in the embodiment is installed on the apparatus main body 2 of the laser processing apparatus 1. The indexing feed unit 50 supports the Y-axis direction moving plate 15 movably in the Y-axis direction. The indexing feed unit 50 includes a well-known ball screw 51, a well-known pulse motor 52, and well-known guide rails 53. The ball screw 51 is provided rotatably about an axis. The pulse motor 52 rotates the ball screw 51 about the axis. The guide rails 53 support the Y-axis direction moving plate 15 movably in the Y-axis direction. The guide rails 53 are arranged so as to be fixed to the apparatus main body 2.

The laser processing apparatus 1 may further include a Z-axis moving unit that moves the condensing lens included in the laser beam irradiating unit 20 in the Z-axis direction. The Z-axis moving unit is, for example, installed on a column 3 erected from the apparatus main body 2. The Z-axis moving unit supports the condensing lens of the laser beam irradiating unit 20 movably in the Z-axis direction.

The imaging unit 60 images the workpiece 100 held on the chuck table 10. The imaging unit 60 includes a CCD camera or an infrared camera that images the workpiece 100 held on the chuck table 10.

The display unit 70 is a display unit formed by a liquid crystal display apparatus or the like. The display unit 70 includes a display surface 71 and a notifying unit 72. The display surface 71 displays a state of processing operation, an image, or the like. The notifying unit 72 notifies an operator of the laser processing apparatus 1 of predetermined notification information by emitting at least one of sound and light. The notifying unit 72 may be an external notifying apparatus such as a speaker or a light emitting apparatus. In a case where the display surface 71 includes a touch panel, the display unit 70 may include an input unit. The input unit can receive various kinds of operations such as registration of processing content information by the operator. The input unit may be an external input apparatus such as a keyboard. Information or an image displayed on the display surface 71 of the display unit 70 is changed by an operation of the input unit or the like. The display unit 70 is connected to the control unit 80.

The control unit 80 makes the laser processing apparatus 1 perform processing operation on the workpiece 100 by controlling each of the above-described constituent elements of the laser processing apparatus 1. The control unit 80 controls the laser beam irradiating unit 20, the processing feed unit 40, the indexing feed unit 50, the imaging unit 60, and the display unit 70. The control unit 80 is a computer including an arithmetic processing apparatus as arithmetic means, a storage apparatus as storing means, and an input-output interface apparatus as communicating means. The arithmetic processing apparatus, for example, includes a microprocessor such as a central processing unit (CPU). The storage apparatus has a memory such as a read only memory (ROM) or a random access memory (RAM). The arithmetic processing apparatus performs various kinds of operations on the basis of a predetermined program stored in the storage apparatus. The arithmetic processing apparatus controls the laser processing apparatus 1 by outputting various kinds of control signals to the above-described constituent elements via the input-output interface apparatus according to a result of the operation.

The control unit 80 makes the imaging unit 60 image the workpiece 100. The control unit 80 performs image processing on an image imaged by the imaging unit 60. The control unit 80 detects a planned dividing line of the workpiece 100 by the image processing. The control unit 80 drives the processing feed unit 40 and the indexing feed unit 50 such that the condensing point 32 of the laser beam 30 moves along the planned dividing line, and makes the laser beam irradiating unit 20 apply the laser beam 30. The control unit 80 allows to measure the power of the leakage light 31 of the laser beam 30 by the power measuring unit 24 while making the laser beam irradiating unit 20 apply the laser beam 30. The control unit 80 in the embodiment includes a signal generating section 81, a signal synchronizing section 82, a pass/fail determining section 83, a warning notifying section 84, and a recording section 85.

The signal generating section 81 generates a gate signal 811 that controls timing of pulse oscillation of the laser oscillator 21 of the laser beam irradiating unit 20. The signal generating section 81 outputs the gate signal 811 to the signal synchronizing section 82 and the recording section 85.

The signal synchronizing section 82 obtains the gate signal 811 from the signal generating section 81. The signal synchronizing section 82 in the embodiment obtains a measurement result of the power measuring unit 24 when receiving the gate signal 811. The signal synchronizing section 82 synchronizes timing of measurement of the power of the leakage light 31 of the laser beam 30 by the power measuring unit 24 with the gate signal 811 generated by the signal generating section 81. The signal synchronizing section 82 outputs the measurement result of the power measuring unit 24 which measurement result is synchronized with the gate signal 811 to the pass/fail determining section 83 and the recording section 85.

The pass/fail determining section 83 obtains the measurement result of the power measuring unit 24 which measurement result is synchronized with the gate signal 811 from the signal synchronizing section 82. The pass/fail determining section 83 determines whether or not the power of the leakage light 31 of the laser beam 30 measured by the power measuring unit 24 is within a predetermined threshold value range 91. The threshold value range 91 represents a range between an upper limit threshold value 92 higher than a normal power 90 of the leakage light 31 of the laser beam 30 in FIG. 4 and a lower limit threshold value 93 lower than the normal power 90. In an example depicted in FIG. 4, when the power of the leakage light 31 of the laser beam 30 falls below the lower limit threshold value 93, the pass/fail determining section 83 determines that the power of the leakage light 31 of the laser beam 30 is outside the predetermined threshold value range 91. The pass/fail determining section 83 outputs, to the warning notifying section 84 and the recording section 85, a determination result indicating that the power of the leakage light 31 of the laser beam 30 is outside the predetermined threshold value range 91.

The pass/fail determining section 83 further determines whether or not an amount of variation in the position of the leakage light 31 of the laser beam 30 measured by the power measuring unit 24 is within a predetermined threshold value range 96. As depicted in FIG. 5, the predetermined threshold value range 96 of the amount of variation in the position is, for example, a range equal to or less than a predetermined distance from a reference position 95, through which the optical axis of the normal laser beam 30 passes, in a plane direction orthogonal to the optical axis, in the measurement plane 245 of the power measuring unit 24. The predetermined threshold value range 96 of the amount of variation in the position may be represented in the shape of a perfect circle on the plane orthogonal to the optical axis or may be represented in an elliptic shape as in an example depicted in FIG. 5. In the case where the power measuring unit 24 includes a PSD, for example, the amount of variation in the position of the leakage light 31 may be determined on the basis of a threshold value based on the current ratio of each current flowing in the resistance layer of the PSD. In an example depicted in FIG. 5, a part of the leakage light 31 of the laser beam 30 measured by the power measuring unit 24 lies off the predetermined threshold value range 96. In this case, the pass/fail determining section 83 determines that the amount of variation in the position of the leakage light 31 of the laser beam 30 is outside the predetermined threshold value range 96. The pass/fail determining section 83 outputs, to the warning notifying section 84 and the recording section 85, a determination result indicating that the amount of variation in the position of the leakage light 31 of the laser beam 30 is outside the predetermined threshold value range 96.

The control unit 80 stops the oscillation of the laser from the laser oscillator 21 while indexing-feeding the chuck table 10 in the Y-axis direction during laser processing by the laser processing apparatus 1. That is, as depicted in FIG. 3, in a case where the power measuring unit 24 measures the power of the leakage light 31 of the laser beam 30 at all times, the measured power value of the power measuring unit 24 is substantially zero when the gate signal 811 is off.

When the signal synchronizing section 82 synchronizes timing of measurement of the power of the leakage light 31 of the laser beam 30 with the gate signal 811, the measured power value when the gate signal 811 is off can be excluded. That is, the signal synchronizing section 82 determines whether or not the power of the leakage light 31 of the laser beam 30 is within the predetermined threshold value range 91, on the basis of the measured power value of the power measuring unit 24, only in time periods 812 in which a pulse is oscillated from the laser oscillator 21. A quantitative evaluation of the measured power value thereby becomes possible, as depicted in FIG. 4. More specifically, it is possible to evaluate whether or not the power of the leakage light 31 of the laser beam 30 measured by the power measuring unit 24 is within a power range suitable for processing.

When the power of the leakage light 31 falls below the lower limit threshold value 93, for example, a decrease in the power of the laser oscillator 21, a defect in an optical element, or the like can be predicted. When the power of the leakage light 31 exceeds the upper limit threshold value 92, for example, damage to the reflective film of the mirror 22, the falling off of an optical element itself, or the like can be predicted. In addition, investigation of a cause of a decrease in power or the like is facilitated by comparing the respective measured power values of the first power measuring unit 241, the second power measuring unit 242, and the third power measuring unit 243 with each other.

The warning notifying section 84 obtains a determination result of the pass/fail determining section 83. The warning notifying section 84 makes the notifying unit 72 give notification of predetermined warning information, when the pass/fail determining section 83 determines that at least one of the power of the leakage light 31 of the laser beam 30 measured by the power measuring unit 24 and the amount of variation in the position of the leakage light 31 of the laser beam 30 is outside the predetermined threshold value range 91 or 96. The warning notifying section 84 makes the notifying unit 72 give notification of predetermined warning information, when the pass/fail determining section 83 determines that a measurement result of at least one power measuring unit 24 of the plurality of power measuring units 241, 242, and 243 is outside the predetermined threshold value range 91 or 96.

In an example depicted in FIG. 4, when the power of the leakage light 31 of the laser beam 30 falls below the lower limit threshold value 93, for example, the warning notifying section 84 obtains, from the pass/fail determining section 83, a determination result indicating that the power of the leakage light 31 of the laser beam 30 is outside the predetermined threshold value range 91. On the basis of the obtained determination result of the pass/fail determining section 83, the warning notifying section 84 makes the notifying unit 72 give notification of predetermined warning information indicating that the power of the leakage light 31 of the laser beam 30 is below the lower limit threshold value 93. In an example depicted in FIG. 5, for example, the warning notifying section 84 obtains, from the pass/fail determining section 83, a determination result indicating that a part of the leakage light 31 of the laser beam 30 lies off the predetermined threshold value range 96. On the basis of the obtained determination result of the pass/fail determining section 83, the warning notifying section 84 makes the notifying unit 72 give notification of predetermined warning information indicating that a part of the leakage light 31 of the laser beam 30 lies off the predetermined threshold value range 96.

The recording section 85 obtains and records data such as the measurement result of the power measuring unit 24, the gate signal 811 generated by the signal generating section 81, the measurement result of the power measuring unit 24 which measurement result is synchronized by the signal synchronizing section 82, and the determination result of the pass/fail determining section 83. The measurement result data, for example, includes the power measured value of the leakage light 31 of the laser beam 30 which value is measured by each power measuring unit 24, time series data on the incidence position, and the like. The control unit 80 may display the data recorded by the recording section 85 on the display surface 71 of the display unit 70.

As described above, while the laser processing apparatus 1 according to the embodiment irradiates the workpiece 100 with the laser beam 30, the power measuring unit 24 measures the power of the leakage light 31 of the laser beam 30 transmitted without being reflected by the mirror 22. By using the leakage light 31 of the laser beam 30 transmitted by the mirror 22 for power measurement, the laser processing apparatus 1 can monitor the power of the laser beam 30 during processing without stopping the processing while processing the workpiece 100. Hence, it is possible, for example, to quickly find a decrease in power, damage to an optical element, or the like during the processing and suppress a processing defect in the workpiece 100.

Further, a plurality of power measuring units 24 may measure the power of the first leakage light 311 transmitted by the mirror 22 (the first mirror 221) provided immediately in the rear of an emission aperture of the laser oscillator 21 and the second leakage light 312 or the third leakage light 313 passed through a plurality of optical elements and transmitted by the mirror 22 (the second mirror 222 or the third mirror 223). Consequently, investigation of a cause of a decrease in power or the like is facilitated by comparing each piece of leakage light 31 transmitted by each mirror 22 provided between the emission aperture of the laser oscillator 21 and the condensing point 32 of the laser beam 30. More specifically, isolation becomes possible, for example, as to whether the power decrease is caused by a degradation in the laser oscillator 21 or the like or whether the power decrease is caused by an optical element at a midpoint in propagation to the condensing point 32.

It is to be noted that the present invention is not limited to the foregoing embodiment. That is, the present invention can be modified and carried out in various manners without departing from the gist of the present invention. For example, the signal synchronizing section 82 in the present invention may make the power measuring unit 24 measure the power of the leakage light 31 of the laser beam 30 only in the time periods 812 in which the gate signal 811 is received, and obtain a result of the measurement. In this case, the signal synchronizing section 82 controls timing of power measurement of the power measuring unit 24.

In addition, in the embodiment, the pass/fail determining section 83 determines whether or not each of the power of the leakage light 31 of the laser beam 30 and the amount of variation in the position of the leakage light 31 of the laser beam 30 is within the threshold value range 91 or 96. However, the present invention may determine only one of the power and the amount of variation in the position. In this case, the warning notifying section 84 makes the notifying unit 72 give notification of a warning when the one determined by the pass/fail determining section 83 is outside the threshold value range 91 or 96. In addition, while the respective threshold value ranges 91 and 96 are set for the power of the leakage light 31 of the laser beam 30 and the amount of variation in the position in the embodiment, the present invention may set a threshold value range on the basis of a combination of the power and the amount of variation in the position.

In addition, in the embodiment, the warning notifying section 84 makes the notifying unit 72 give notification of predetermined warning information, when the pass/fail determining section 83 determines that the measurement result of at least one power measuring unit 24 of the plurality of power measuring units 241, 242, and 243 is outside the predetermined threshold value range 91 or 96. However, the present invention may make the notifying unit 72 give notification of predetermined warning information, when the pass/fail determining section 83 determines that the measurement results of all of the power measuring units 241, 242, and 243 are outside the predetermined threshold value range 91 or 96.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
   a chuck table configured to hold a workpiece;
   a laser beam irradiating unit configured to irradiate the workpiece held on the chuck table with a pulsed laser beam;
   a processing feed unit configured to processing-feed the chuck table and the laser beam irradiating unit relative to each other;
   an indexing feed unit configured to indexing-feed the chuck table and the laser beam irradiating unit relative to each other; and
   a control unit;
   the laser beam irradiating unit including
      a laser oscillator,
      a first mirror configured to reflect the laser beam emitted from the laser oscillator and propagate the laser beam to a second mirror,
      the second mirror configured to reflect the laser beam reflected from the first mirror and propagate the laser beam to a third mirror,
      the third mirror configured to reflect the laser beam reflected from the second mirror and propagate the laser beam to a processing point for processing the workpiece,
      a first power measuring unit configured to measure power of leakage light of the laser beam transmitted through the first mirror,
      a second power measuring unit configured to measure power of leakage light of the laser beam transmitted through the second mirror,
      a third power measuring unit configured to measure power of leakage light of the laser beam transmitted through the third mirror, and
      a condensing lens configured to condense the laser beam propagated by the third mirror and irradiate the workpiece with the condensed laser beam,
      wherein the control unit allows to measure the power of the leakage light of the laser beam by the power measuring units while irradiating the workpiece with the laser beam.

2. The laser processing apparatus according to claim 1, wherein the workpiece is a semiconductor device wafer or an optical device wafer.

3. The laser processing apparatus according to claim 2, wherein the laser beam is an ultraviolet laser beam.

4. The laser processing apparatus according to claim 2, wherein the power measuring units are position detecting elements.

5. The laser processing apparatus according to claim 2, further comprising first, second, and third wavelength selecting filters positioned between respective first, second, and third mirrors and power measuring units, wherein the wavelength selecting filters transmit only ultraviolet light.

6. The laser processing apparatus according to claim 2, wherein the control unit comprises a signal generating section configured to generate a gate signal that controls timing of pulse oscillation of the laser oscillator of the laser beam irradiating unit, and
   wherein the signal generating section is configured to output the gate signal to a signal synchronizing section and a recording section of the control unit,
   wherein the signal synchronizing section synchronizes timing of measurements of the power of the leakage light of the laser beam by the power measuring units with the gate signal generated by the signal generating section and outputs the measurement results of the power measuring units which measurement result is synchronized with the gate signal to a pass/fail determining section and the recording section of the control unit, and
   wherein the pass/fail determining section determines whether or not an amount of variation in the position of the leakage light of the laser beam measured by a respective power measuring unit is within a predetermined threshold value range.

7. The laser processing apparatus according to claim 6, wherein the predetermined threshold value range of the amount of variation in the position is a range equal to or less than a predetermined distance from a reference position.

8. The laser processing apparatus according to claim 6, wherein the signal synchronizing section determines whether or not the power of the leakage light of the laser beam is within the predetermined threshold value range, on the basis of the measured power value of at least one of the power measuring units, only in time periods in which a pulse is oscillated from the laser oscillator.

9. The laser processing apparatus according to claim 2, wherein the laser beam irradiates the workpiece to form a modified layer in the wafer to serve as a division starting point for dividing the wafer.

* * * * *